United States Patent
Jang et al.

(10) Patent No.: US 11,302,733 B2
(45) Date of Patent: Apr. 12, 2022

(54) IMAGE SENSORS

(71) Applicant: SAMSUNG ELECTRONICS CO., LTD., Suwon-si (KR)

(72) Inventors: Min Jang, Hwaseong-si (KR); Jungchak Ahn, Yongin-si (KR); Junsung Park, Hwaseong-si (KR); Younggu Jin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 16/132,075

(22) Filed: Sep. 14, 2018

(65) Prior Publication Data
US 2019/0088704 A1 Mar. 21, 2019

Related U.S. Application Data

(63) Continuation of application No. 15/668,736, filed on Aug. 4, 2017, now abandoned.

(30) Foreign Application Priority Data

Aug. 5, 2016 (KR) .................. 10-2016-0100033

(51) Int. Cl.
*H01L 31/0232* (2014.01)
*H01L 27/146* (2006.01)

(52) U.S. Cl.
CPC .... *H01L 27/14629* (2013.01); *H01L 27/1463* (2013.01); *H01L 27/1464* (2013.01); *H01L 27/14621* (2013.01); *H01L 27/14685* (2013.01); *H01L 27/14625* (2013.01); *H01L 27/14627* (2013.01); *H01L 27/14641* (2013.01); *H01L 27/14643* (2013.01)

(58) Field of Classification Search
CPC ......... H01L 27/14629; H01L 27/14621; H01L 27/1463; H01L 27/1464; H01L 27/14625; H01L 27/14627; H01L 27/14643; H01L 27/14685; H01L 27/14641
USPC ........................................................ 257/432
See application file for complete search history.

(56) References Cited

U.S. PATENT DOCUMENTS

| | | | |
|---|---|---|---|
| 7,315,014 B2 | 1/2008 | Lee et al. | |
| 8,507,964 B2 | 8/2013 | Nozaki et al. | |
| 8,847,345 B2 | 9/2014 | Handa | |
| 8,946,849 B2 | 2/2015 | Tsai et al. | |
| 9,130,072 B1* | 9/2015 | Chen | H01L 31/02161 |
| 9,287,423 B2 | 3/2016 | Mori et al. | |
| 9,520,423 B2 | 12/2016 | Lee | |
| 9,620,538 B2 | 4/2017 | Lee | |
| 2007/0187787 A1 | 8/2007 | Ackerson et al. | |
| 2010/0253819 A1 | 10/2010 | Yokozawa | |
| 2012/0268631 A1* | 10/2012 | Takase | G02B 3/0068 348/273 |

(Continued)

FOREIGN PATENT DOCUMENTS

KR 20140083748 A 7/2014

*Primary Examiner* — Meiya Li
(74) *Attorney, Agent, or Firm* — Volentine, Whitt & Francos, PLLC

(57) ABSTRACT

An image sensor includes a device isolation layer disposed in a substrate and defining pixel regions, and a grid pattern on a surface of the substrate. The grid pattern overlaps the device isolation layer between adjacent pixel regions in a direction perpendicular to the surface. The grid pattern has a width less than a width of the device isolation layer.

20 Claims, 13 Drawing Sheets

(56) References Cited

U.S. PATENT DOCUMENTS

| | | | |
|---|---|---|---|
| 2013/0134536 A1 | 5/2013 | Mori et al. | |
| 2014/0313379 A1* | 10/2014 | Mackey | H04N 9/04555 |
| | | | 348/279 |
| 2015/0155320 A1* | 6/2015 | Chien | H01L 31/0232 |
| | | | 257/432 |
| 2016/0111458 A1 | 4/2016 | JangJian et al. | |
| 2016/0307941 A1* | 10/2016 | Cheng | H01L 27/1463 |
| 2017/0077163 A1* | 3/2017 | Chou | H04N 5/232122 |
| 2018/0076247 A1* | 3/2018 | Pang | H04N 5/374 |
| 2018/0138329 A1* | 5/2018 | Lin | H01L 31/02162 |

* cited by examiner

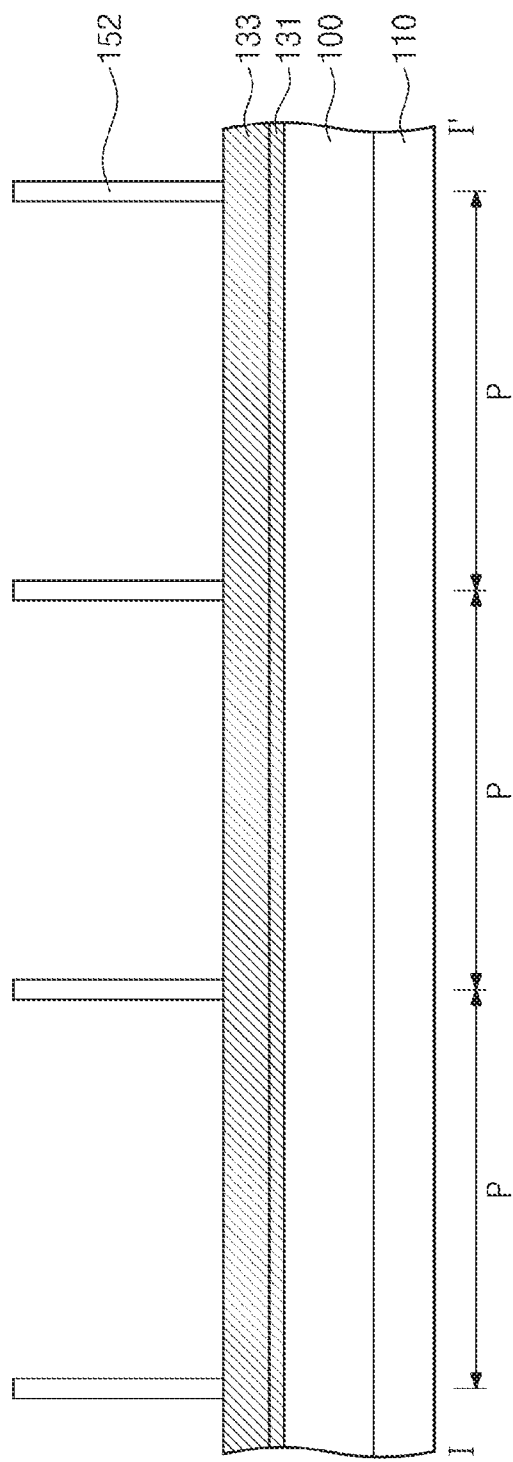

IMAGE SENSORS

CROSS-REFERENCE TO RELATED APPLICATION

This is a Continuation of U.S. application Ser. No. 15/668,736, filed on Aug. 4, 2017, which makes a claim for priority under 35 U.S.C. § 119 to Korean Patent Application 10-2016-0100033 filed on Aug. 5, 2016, the entirety of which are incorporated herein by reference.

BACKGROUND

The present inventive concepts relate to image sensors and, more particularly, to complementary metal oxide semiconductor (CMOS) image sensors.

Image sensors are semiconductor devices that transform light of optical images into electrical signals. Recent advances in computer and communication industries have led to increased demand for high performance image sensors for use in various consumer electronic devices such as digital cameras, camcorders, PCSs (Personal Communication Systems), game devices, security cameras, medical micro cameras, or the like. Accordingly, there currently exists an increasing need to enhance performance of image capturing devices or image sensors included in image capturing devices.

SUMMARY

Embodiments of the inventive concept provide an image sensor having enhanced sensitivity characteristics.

Embodiments of the inventive concept provide an image sensor including a device isolation layer disposed in a substrate and defining pixel regions; and a grid pattern over a surface of the substrate. The grid pattern overlaps the device isolation layer between adjacent pixel regions in a first direction perpendicular to the surface. The grid pattern has a width less than a width of the device isolation layer.

Embodiments of the inventive concept provide an image sensor including a device isolation layer disposed in a substrate and defining pixel regions; photoelectric conversion devices respectively on the pixel regions in the substrate; and a grid pattern over a surface of the substrate and overlapping the device isolation layer in a first direction perpendicular to the surface. The grid pattern is be spaced apart from at least one of the photoelectric conversion devices along a second direction perpindicular to the first direction.

Embodiments of the inventive concept further provide an image sensor including a substrate having an array of photoelectric conversion devices in respective pixel regions defined by a device isolation layer within the substrate. The device isolation layer has a lattice shape. The image sensor further includes a grid pattern over a surface of the substrate. The grid pattern has a lattice shape and overlaps the device isolation layer to partly cover the device isolation layer.

BRIEF DESCRIPTION OF THE DRAWINGS

FIG. 7A to 7D illustrate cross-sectional view descriptive of a method of forming a grid pattern discussed with reference to FIGS. 4 to 5.

DETAILED DESCRIPTION OF EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
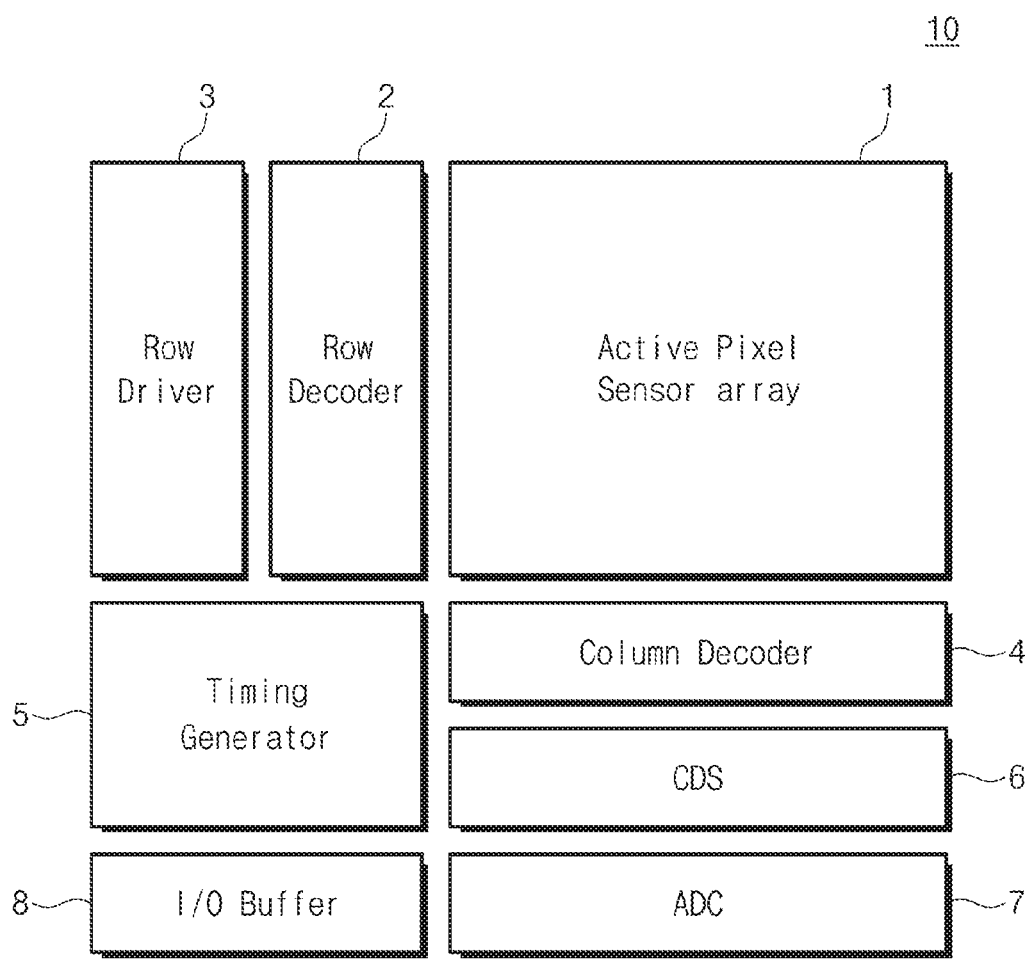
FIG. 1 illustrates a block diagram of an image sensor according to embodiments of the inventive concept.

FIG. 1 illustrates a block diagram of an image sensor according to embodiments of the inventive concept.

Referring to FIG. 1, an image sensor 10 includes an active pixel sensor array (APS) 1, a row decoder 2, a row driver 3, a column decoder 4, a timing generator 5, a correlated double sampler (CDS) 6, an analog-to-digital converter (ADC) 7, and an input/output (I/O) buffer 8 which are variously interconnected by wiring or the like (not shown).

The active pixel sensor array 1 may include a plurality of two-dimensionally arranged unit pixels, each of which is configured to convert optical signals into electrical signals. The active pixel sensor array 1 may be driven by a plurality of driving signals such as a pixel select signal, a reset signal, and a charge transfer signal provided from the row driver 3.

The converted electrical signals may be provided from the active pixel sensor array 1 to the correlated double sampler 6.

In some embodiments of the inventive concept, the image sensor 10 may perform an auto focusing operation via phase difference detection of light incident onto the active pixel sensor array 1. Each of the unit pixels of the active pixel sensor array 1 may output a focus signal corresponding to phase difference of light incident onto a pair of photoelectric conversion devices. To perform the auto focusing operation, the focus signal may be used as a signal to adjust lens positions of an image capturing device including the image sensor 10.

The row driver 3 may provide the active pixel sensor array 1 with several driving signals for driving several unit pixels in accordance with a decoded result obtained from the row decoder 2. In the case that the unit pixels are arranged in a matrix shape, the driving signals may be supplied to respective rows.

The timing generator 5 may provide timing and control signals to the row decoder 2 and the column decoder 4.

The correlated double sampler 6 may receive the electrical signals generated in the active pixel sensor array 1, and hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter 7 may convert analog signals, which correspond to the difference level received from the correlated double sampler 6, into digital signals, and then output the converted digital signals.

The input/output buffer 8 may latch the digital signals and then sequentially output the latched digital signals to an image signal processing unit (not shown) in response to the decoded result obtained from the column decoder 4.

Figure 2:
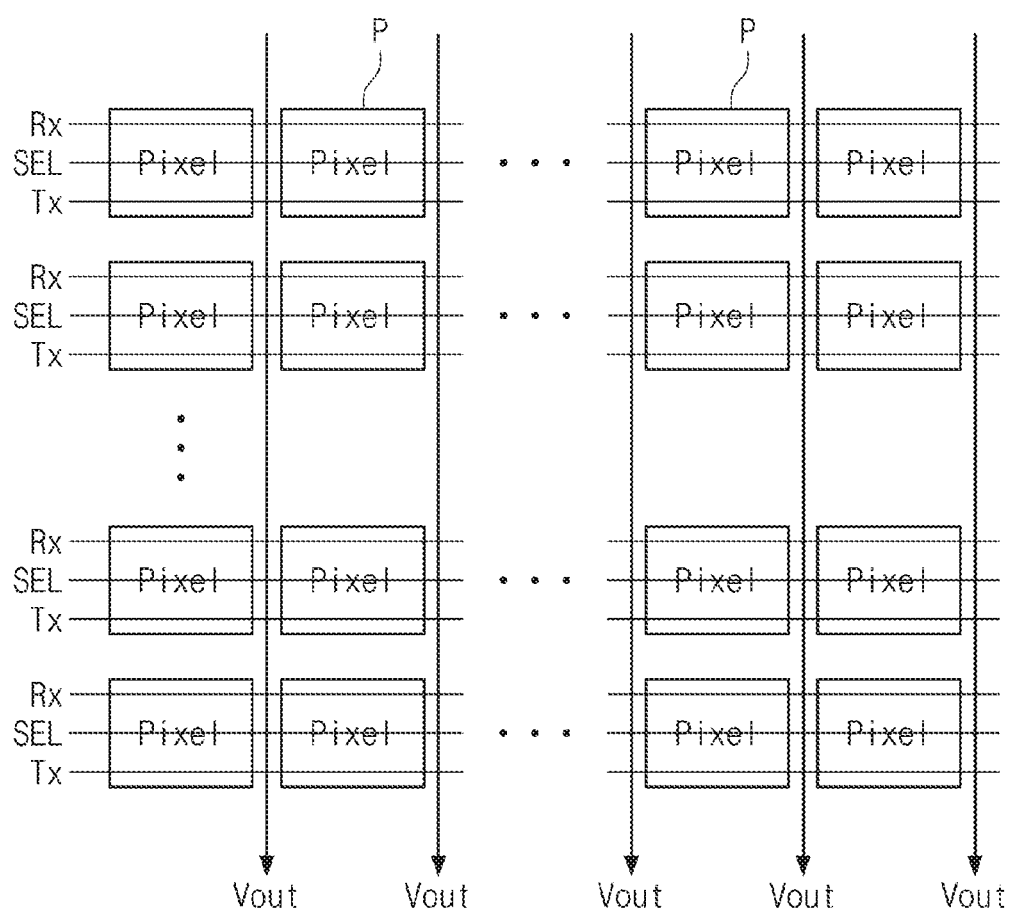
FIG. 2 illustrates a circuit diagram of an active pixel sensor array of an image sensor according to embodiments of the inventive concept.

FIG. 2 illustrates a circuit diagram of an active pixel sensor array 1 of an image sensor according to embodiments of the inventive concept.

Referring to FIG. 2, the active pixel sensor array 1 may include a plurality of unit pixel regions P that are two-dimensionally arranged along rows and columns. Incident light may be converted into electrical signals at each of the unit pixel regions P, and the unit pixel regions P may be driven by driving signals transmitted through a pixel select line SEL, a charge transfer line Tx, and a reset line Rx that are connected to the unit pixel regions P. The electrical signals converted at the unit pixel regions P may be provided to a control circuit (not shown) through output lines Vout.

Figure 3:
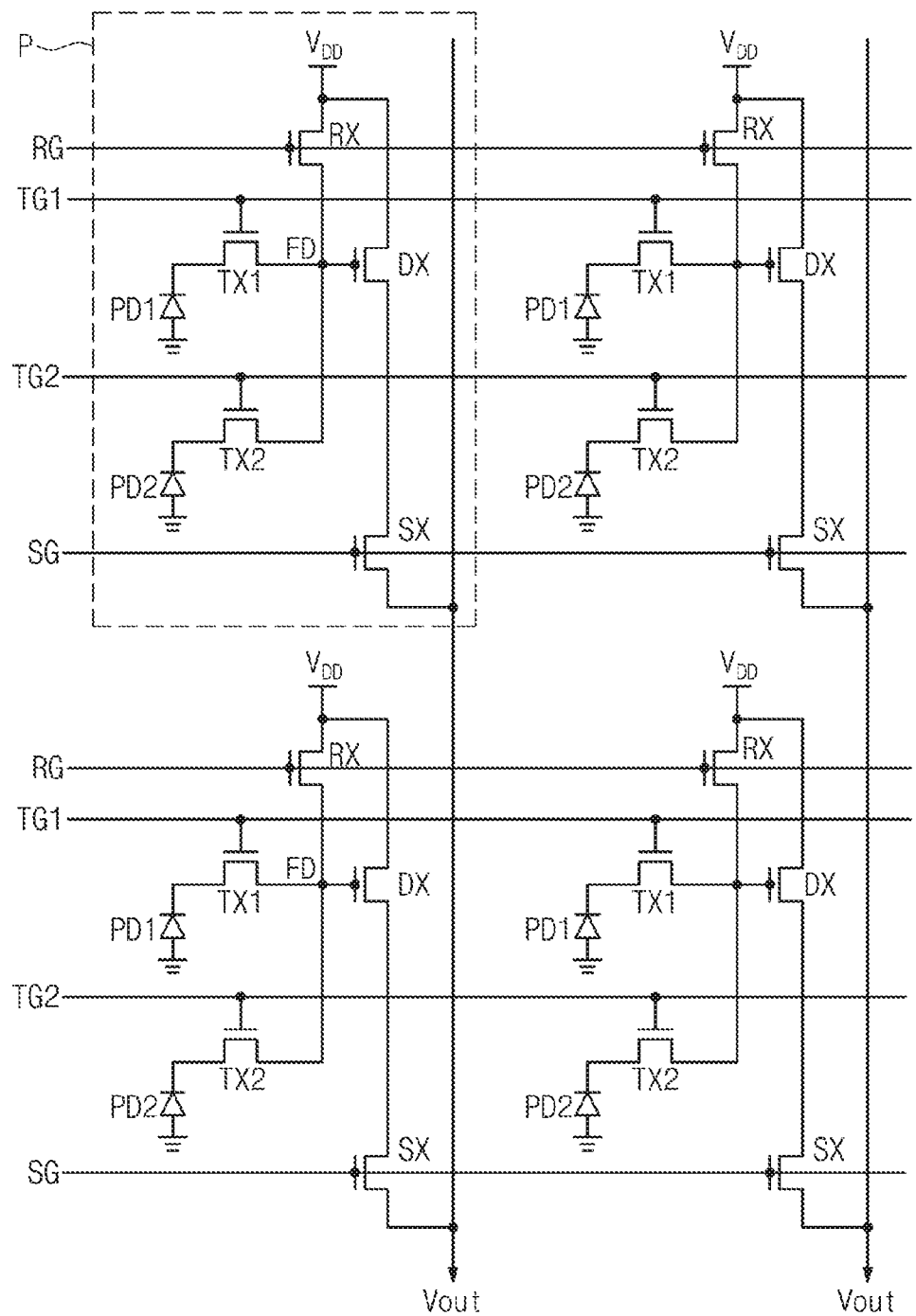
FIG. 3 illustrates a circuit diagram of an active pixel sensor array of an image sensor according to embodiments of the inventive concept.

FIG. 3 illustrates a circuit diagram of an active pixel sensor array 1 of an image sensor according to embodiments of the inventive concept.

Referring to FIG. 3, the active pixel sensor array 1 may include the plurality of unit pixel regions P, which may be arranged in a matrix shape along row and column directions. Each of the unit pixel regions P may include first and second photoelectric conversion devices PD1 and PD2, transfer transistors TX1 and TX2, and logic transistors RX, SX and DX. The logic transistors RX, SX and DX may include a reset transistor RX, a select transistor SX, and a drive transistor or source follower transistor DX. Gate electrodes of the first transfer transistors TX1, the second transfer transistor TX2, the reset transistor RX, and the select transistor SX may be connected to a corresponding one of driving signal lines TG1, TG2, RG and SG. The driving signal lines TG1 and TG2 may be hereinafter referred to as a first transfer gate TG1 and a second transfer gate TG2. The driving signal lines TG1 and TG2 may correspond to the charge transfer line Tx shown in FIG. 2, the driving signal line RG may correspond to the reset line Rx shown in FIG. 2, and the driving signal line SG may correspond to the pixel select line SEL shown in FIG. 2. The driving signal lines RG and SG may hereinafter be respectively referred to as the reset signal line RG and the pixel select line SG.

The first transfer transistor TX1 may include the first transfer gate TG1 and the first photoelectric conversion device PD1, and the second transfer transistor TX2 may include the second transfer gate TG2 and the second photoelectric conversion device PD2. The first and second transfer transistors TX1 and TX2 are connected to and share a charge detect node FD (i.e., a floating diffusion region).

The first and second photoelectric conversion devices PD1 and PD2 may generate and accumulate photo-charges in proportion to an amount of light incident from external. The first and second photoelectric conversion devices PD1 and PD2 may be one of for example a photo diode, a photo transistor, a photo gate, a pinned photo diode (PPD), and any combination thereof. The first photoelectric conversion device PD1 is connected between ground and the first transfer transistor TX1, and the second photoelectric conversion device PD2 is connected between ground and the second transfer transistor TX2.

The first and second transfer transistors TX1 and TX2 may respectively transfer the charges which are accumulated in the first and second photoelectric conversion devices PD1 and PD2 to the charge detect node FD (i.e., the floating diffusion region), responsive to charge transfer signals provided to the first and second transfer gates TG1 and TG2. The first and second transfer gates TG1 and TG2 may receive complementary charge transfer signals. In other words, the charges may be transferred to the charge detect node FD from one of the first and second photoelectric conversion devices PD1 and PD2 at a time.

The charge detect node FD may receive and accumulatively store the charges generated from the first and second photoelectric conversion devices PD1 and PD2. The drive transistor DX may be controlled by an amount of photo-charges accumulated in the charge detect node FD.

The reset transistor RX may periodically reset the charges accumulated in the charge detect node FD. In detail, the reset transistor RX may have a drain electrode connected to the charge detect node FD and a source electrode connected to a power supply voltage VDD. When the reset transistor RX is turned on responsive to a reset signal on the reset line RG, the charge detect node FD may receive the power supply voltage VDD connected to the source electrode of the reset transistor RX. Accordingly, when the reset transistor RX is turned on, the charges accumulated in the charge detect node FD may be exhausted and thus the charge detect node FD may be reset.

In conjunction with a static current source (not shown) located outside the unit pixel regions P, the drive transistor DX may serve as a source follower buffer amplifier. The drive transistor DX may amplify a variation in electrical potential of the charge detect node FD and output the amplified electrical potential to an output line Vout.

The select transistor SX may select each row of the unit pixel regions P to be read. When the select transistor SX is turned on responsive to a pixel select signal on the pixel select line SG, the power supply voltage VDD connected to the drain electrode of the drive transistor DX may be transmitted to a drain electrode of the select transistor SX.

Figure 4:
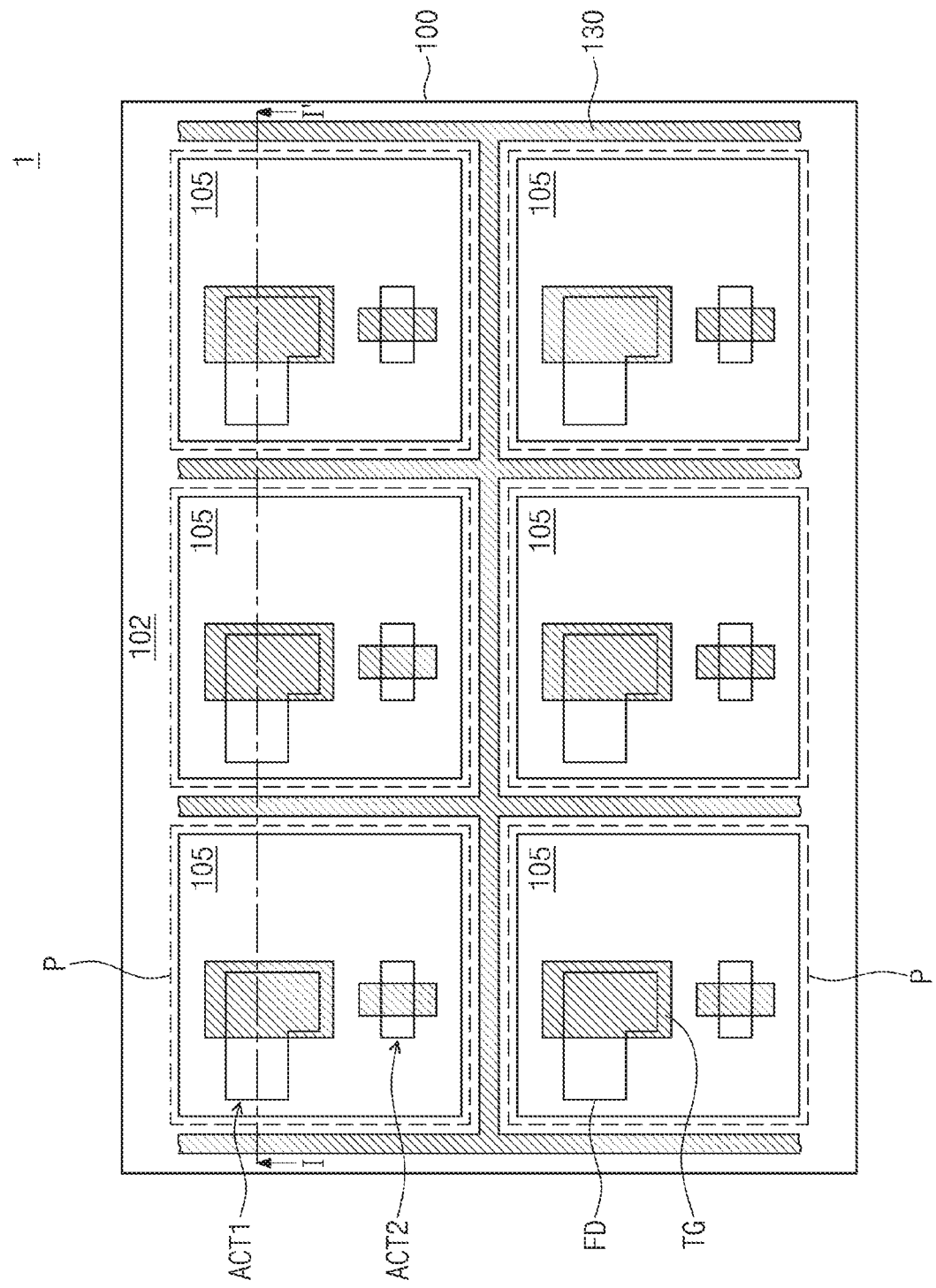
FIG. 4 illustrates a plan view of an active pixel sensor array according to embodiments of the inventive concept.
Figure 5:
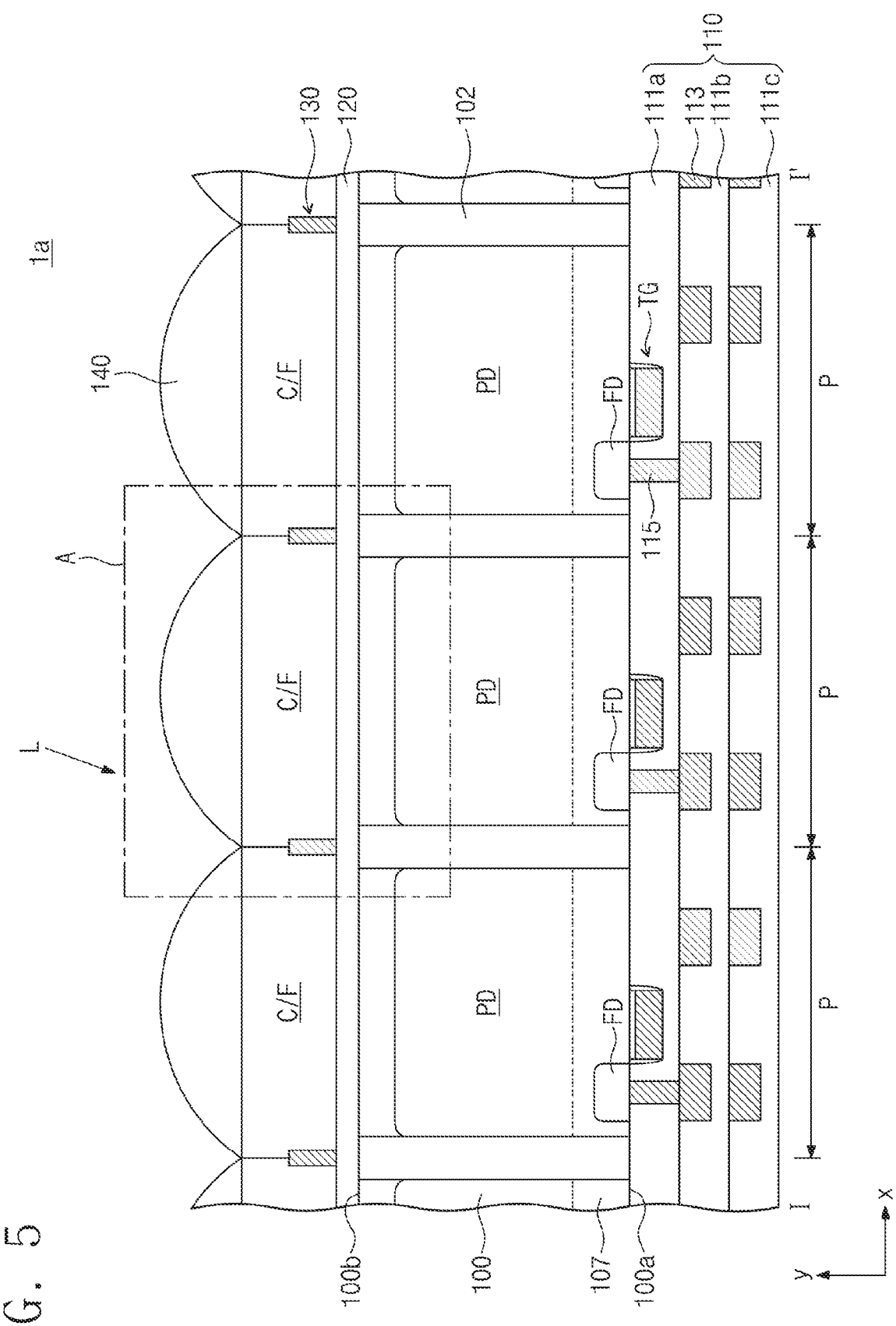
FIG. 5 illustrates a cross-sectional view taken along line I-I' of FIG. 4, showing an active pixel sensor array according to embodiments of the inventive concept.

FIG. 4 illustrates a plan view of an active pixel sensor array 1 according to embodiments of the inventive concept. FIG. 5 illustrates a cross-sectional view taken along line I-I' of FIG. 4, showing an active pixel sensor array 1 according to embodiments of the inventive concept. In this description, a direction vertical to a substrate 100 (or perpendicular to planar upper or lower (main) surfaces of substrate 100) may be defined as a y-direction, and a horizontal direction perpendicular to the first direction may be defined as an x-direction, as shown in FIG. 5. The y-direction and the x-direction may hereinafter be respectively referred to as the first direction and the second direction. FIG. 5 shows the active pixel sensor array 1a as one example of the active pixel sensor array 1 of FIG. 4.

Referring to FIGS. 4 and 5, the substrate 100 may include a first surface 100a and a second surface 100b facing each other. For example, the first surface 100a may be a front surface of the substrate 100 and the second surface 100b may be a rear surface of the substrate 100. Circuits may be disposed on the first surface 100a, and light may be incident onto the second surface 100b. The substrate 100 may for example be a silicon substrate doped with a first conductive impurity, for example an n-type impurity. In other embodiments of the inventive concept, substrate 100 may for example be one of a germanium substrate, a silicon-germanium substrate, a Group II-VI compound substrate, a Group III-V compound substrate, and an SOI (Silicon On Insulator) substrate. In some embodiments, the first conductive impurity may have a concentration that decreases approaching the second surface 100b from the first surface 100a of the substrate 100.

The substrate 100 may include a first device isolation layer 102 and a plurality of pixel regions P defined by the first device isolation layer 102. The first device isolation layer 102 may vertically extend along the first direction from the first surface 100a to the second surface 100b of the substrate 100. The first device isolation layer 102 may have a vertical thickness substantially the same as that of the substrate 100. In plan view, the first device isolation layer 102 may have a lattice shape. The first device isolation layer 102 may be referred to as a deep trench isolation (DTI) layer formed in the substrate 100. The first device isolation layer 102 may be formed of an insulative material having a refractive index less than that of the substrate 100 (e.g., silicon). For example, the first device isolation layer 102 may include silicon oxide. As shown in FIG. 5, the first device isolation layer 102 may have a substantially uniform width along the first direction. In some embodiments of the inventive concept, the first device layer 102 may have a width that decreases approaching the second surface 100b from the first surface 100a of the substrate 100. Also, although not shown in the figures, in some embodiments the first device isolation layer 102 may include a plurality of liners or insulation layers.

In some embodiments of the inventive concept, photo-charges may be generated in proportion to intensity of light incident onto the pixel regions P. For example, the entirety of the pixel regions P defined by the first device isolation layer 102 may generate the photo-charges proportional to the intensity of incident light. The first device isolation layer 102 may refract an obliquely incident light L, such that the pixel regions P may not receive incident light L obliquely incident onto neighboring pixel regions P. That is, the device isolation layer 102 may prevent a pixel region P from receiving light that is obliquely incident on a neighboring pixel region P. As the first device isolation layer 102 penetrates the substrate 100, adjacent pixel regions P may be completely separated from each other. In this configuration, photo-charges generated from the substrate 100, onto which light is incident, of each pixel region P may be prevented from randomly drifting to neighboring pixel regions P.

A photoelectric conversion device PD may be disposed in the substrate 100 of each pixel region P. The photoelectric conversion device PD may be disposed spaced apart from the first surface 100a of the substrate 100. The photoelectric conversion device PD may be, for example, an n-type impurity doped region. A well region 107 may be disposed on the pixel region P of the substrate 100. The well region 107 may be disposed adjacent to the first surface 100a of the substrate 100. A depth from the first surface 100a to the well region 107 may be less than a depth of the first device isolation layer 102 from the first surface 100a. The well region 107 may be, for example, a p-type impurity doped region.

In some embodiments, first and second active zones ACT1 and ACT2 may be defined by a second device isolation layer 105, which may be disposed adjacent to the first surface 100a of the substrate 100. The second device isolation layer 105 may be disposed in the well region 107 and define the first and second active zones ACT1 and ACT2 on each of pixel regions P. The first and second active zones ACT1 and ACT2 may be a portion of the well region 107. The first and second active zone ACT1 and ACT2 may be disposed spaced apart from each other on each of the pixel regions P. The first and second active zones ACT1 and ACT2 may have sizes and shapes different from each other. In some embodiments, as shown in FIG. 4, in plan view each of the second active zones ACT2 on adjacent pixel regions P may be disposed between the first active zones ACT1 on the adjacent pixel regions P.

In some embodiments, for example, a transfer gate TG and a floating diffusion region FD may be disposed on the first active zone ACT1 in the substrate 100 of each of the pixel regions P. The floating diffusion region FD may be disposed closely adjacent to the first surface 100a of the substrate 100. The floating diffusion region FD may be a doped region whose conductivity is opposite to that of the well region 107. The floating diffusion region FD may be, for example, an n-type impurity doped region. The transfer gate TG may be disposed on the first surface 100a of the substrate 100. The transfer gate TG may be disposed on each of the pixel regions P. In some embodiments, the transfer gate TG may be disposed as neighboring or next to the floating diffusion region FD.

Logic transistors may be disposed on the second active zones ACT2 of the pixel regions P. For example, the logic transistors may be one of a reset transistor RX, a source follower (drive) transistor DX, and a select transistor SX such as shown in FIG. 3. Two adjacent pixel regions P may share the logic transistors.

An interconnect line structure 110 may be disposed on the first surface 100a of the substrate 100. The interconnect line structure 110 may include the logic transistors, interconnect lines 113 connected to the logic transistors, and contact plugs 115. Interlayer dielectric layers 111a, 111b and 111c may be disposed stacked on the first surface 100a of the substrate 100, and may cover the transfer gate TG. A plurality of contact plugs 115 and a plurality of interconnect lines 113 may be disposed in the interlayer dielectric layers 111a, 111b and 111c. The contact plugs 115 may electrically connect the logic transistors to the floating diffusion region FD.

Color filters C/F and micro lenses 140 may be disposed on or over the second surface 100b of the substrate 100. An antireflection layer 120 may be disposed between the color filters C/F and the second surface 100*b* of the substrate 100. The antireflection layer 120 may completely cover the second device isolation layer 105. The antireflection layer 120 may prevent light reflection such that the photoelectric conversion region PD may be allowed to readily receive light incident onto the second surface 100*b* of the substrate 100.

The color filters C/F and the micro lenses 140 may be disposed to correspond to the pixel regions P. The color filters C/F may include one of red, green, and blue filters depending on a unit pixel. The color filters C/F may be two-dimensionally arranged. Alternatively, the color filters C/F may include yellow, magenta, and cyan filters. The color filters C/F may further include a white filter.

The micro lens 140 may have a convex shape and a predetermined curvature radius. The micro lens 140 may be formed of a light-transmissive resin and may condense incident light onto each pixel region P.

A grid pattern 130 may be disposed on the antireflection layer 120. In more detail, the grid pattern 130 may be disposed on or over the second surface 100*b* of the substrate 100 and between adjacent color filters C/F. The grid pattern 130 may overlap the first device isolation layer 102 between adjacent pixel regions P in the first direction. That is, the grid pattern 130 may extend over the first device isolation layer 102 so as to partly cover the first device isolation layer 102. In plan view, the grid pattern 130 may have a lattice shape. In plan view, the grid pattern 130 may be spaced apart from at least one of its adjacent photoelectric conversion devices PD along (or in) the second direction. In plan view, at least a portion of the first device isolation layer 102 may be exposed between the grid pattern 130 and the spaced one of the photoelectric conversion devices PD. That is, there is at least a portion of the first isolation layer 102 that is between the grid pattern 130 and one of the photoelectric conversion devices PD, and the at least one portion is not overlapped or covered by the grid pattern 130. The grid pattern 130 may reflect the light L obliquely incident onto the second surface 100*b* of the substrate 100 to allow the pixel regions P to receive corresponding reflected light L.

Figure 6:
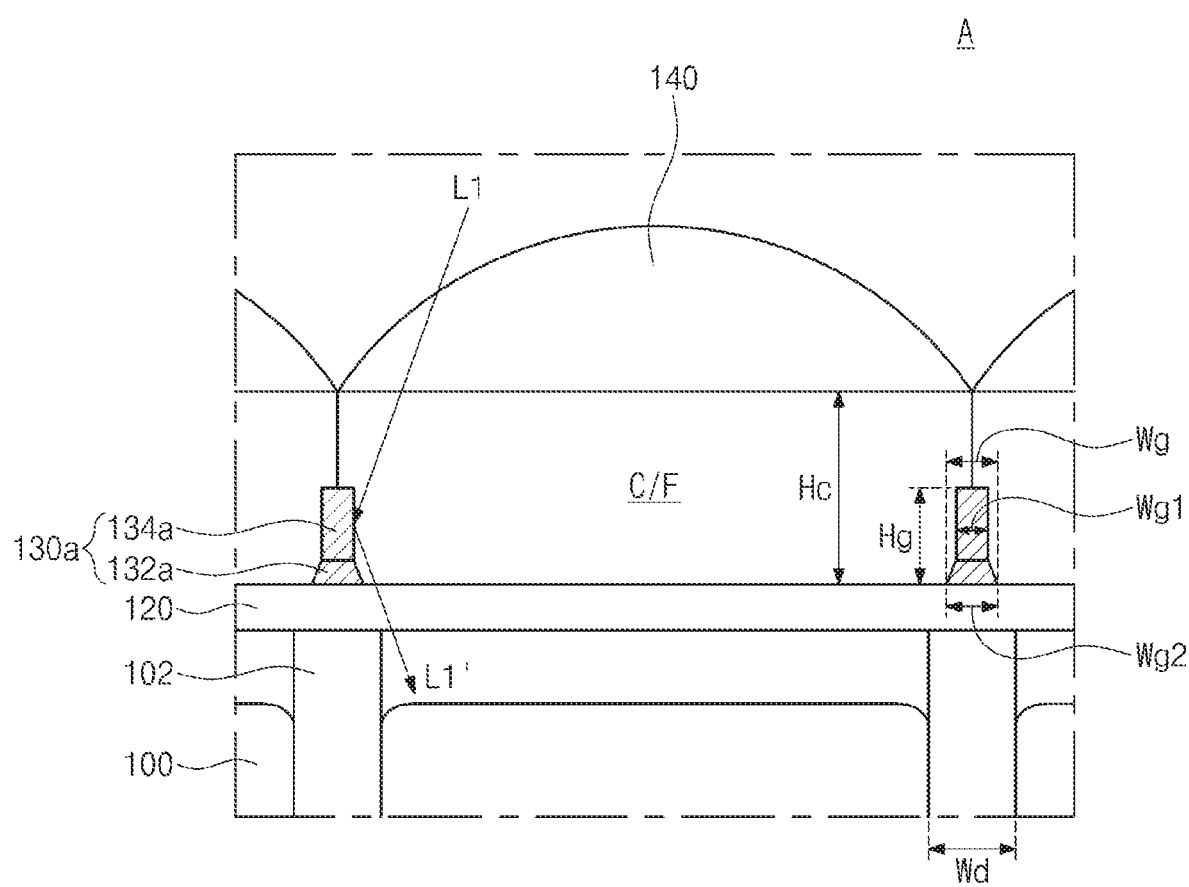
FIG. 6 illustrates an enlarged view of section A in FIG. 5, showing a grid pattern according to embodiments of the inventive concept.

FIG. 6 illustrates an enlarged view of section A in FIG. 5, showing a grid pattern 130*a* according to embodiments of the inventive concept. Referring to FIG. 6, the grid pattern 130*a* may include a lower grid 132*a* and an upper grid 134*a* that are sequentially stacked. The upper grid 134*a* may be an upper portion of the grid pattern 130*a*, and the lower grid 132*a* may be a lower portion of the grid pattern 130*a*. The lower and upper grids 132*a* and 134*a* may include different kinds of metals from each other. For example, the upper grid 134*a* may include tungsten (W), and the lower grid 132*a* may include titanium nitride (TiN), although in other embodiments the upper and lower grids 132*a* and 134*a* may be other materials. The lower grid 132*a* may contact the upper grid 134*a* to the antireflection layer 120.

The grid pattern 130*a* may have a substantially uniform width or a substantially non-uniform width along the first direction. For example, the lower and upper grids 132*a* and 134*a* may have widths different from each other. The upper grid 134*a* may have a first width Wg1, and the lower grid 132*a* may have a second width Wg2. The first width Wg1 may be substantially uniform along the first direction. The second width Wg2 may be greater than or equal to the first width Wg1. For example, the second width Wg2 of the lower grid 132*a* may gradually increase approaching the substrate 100 from the upper grid 134*a*. The second width Wg2 may be a maximum allowed width of the lower grid 132*a*. The grid pattern 130*a* may thus have a width Wg, which may correspond to a maximum allowed width (e.g., the second width Wg2) of the lower grid 132*a*. Although FIG. 6 shows that the second width Wg2 is greater than the first width Wg1, in other embodiments the second width Wg2 may be substantially the same as the first width Wg1.

The width Wg of the grid pattern 130*a* may be less than a width Wd of the first device isolation layer 102. For example, the width Wg of the grid pattern 130*a* may be about 100 nm or less. As such, in plan view the first device isolation layer 102 may surround opposite sides of the grid pattern 130*a*. Although FIG. 6 shows that the first device isolation layer 102 has the uniform width Wd along the first direction, in other embodiments of the inventive concept the first device isolation layer 102 may have a non-uniform width along the first direction. In this case, the width Wd of the first device isolation layer 102 may be a minimum allowable width of the first device isolation layer 102.

The grid pattern 130*a* may have a height Hg less than a height Hc of each of the color filters C/F. For example, the height Hg of the grid pattern 130*a* may be equal to or less than half the height Hc of each of the color filters C/F. The upper grid 134*a* may have a height greater than that of the lower grid 132*a*. For example, the height of the upper grid 134*a* may be about 1 to 5 times the height of the lower grid 132*a*.

According embodiments of the inventive concept, the grid pattern 130*a* may reflect the obliquely incident light L1 so that the pixel region P may receive corresponding reflected light L1'. An amount of light incident onto corresponding pixel region P may increase as the width Wg and the height Hg of the grid pattern 130*a* decreases, thereby enhancing sensitivity and SNR (signal-to-noise ratio). Differently from the embodiments of the inventive concept, if the width of the grid pattern is greater than the width of the first device isolation layer or the grid pattern is spaced apart from the first device isolation layer in plan view, an optical dead zone may be formed in the substrate 100 overlapped with the grid pattern in the first direction. An amount of light incident onto the pixel regions P may therefore decrease due to the optical dead zone. In addition, if the height of the grid pattern is greater than half the height of the color filters, the grid pattern may receive increased amount of incident light, so that loss of incident light may occur. For example, a portion of light incident onto the grid pattern may be reflected to travel into the pixel region P, while another portion of light may be lost due to its transmission through the grid pattern.

FIGS. 7A, 7B, 7C and 7D illustrate cross-sectional views descriptive of a method of forming a grid pattern 130 discussed with reference to FIGS. 4 to 6.

Figure 7A:
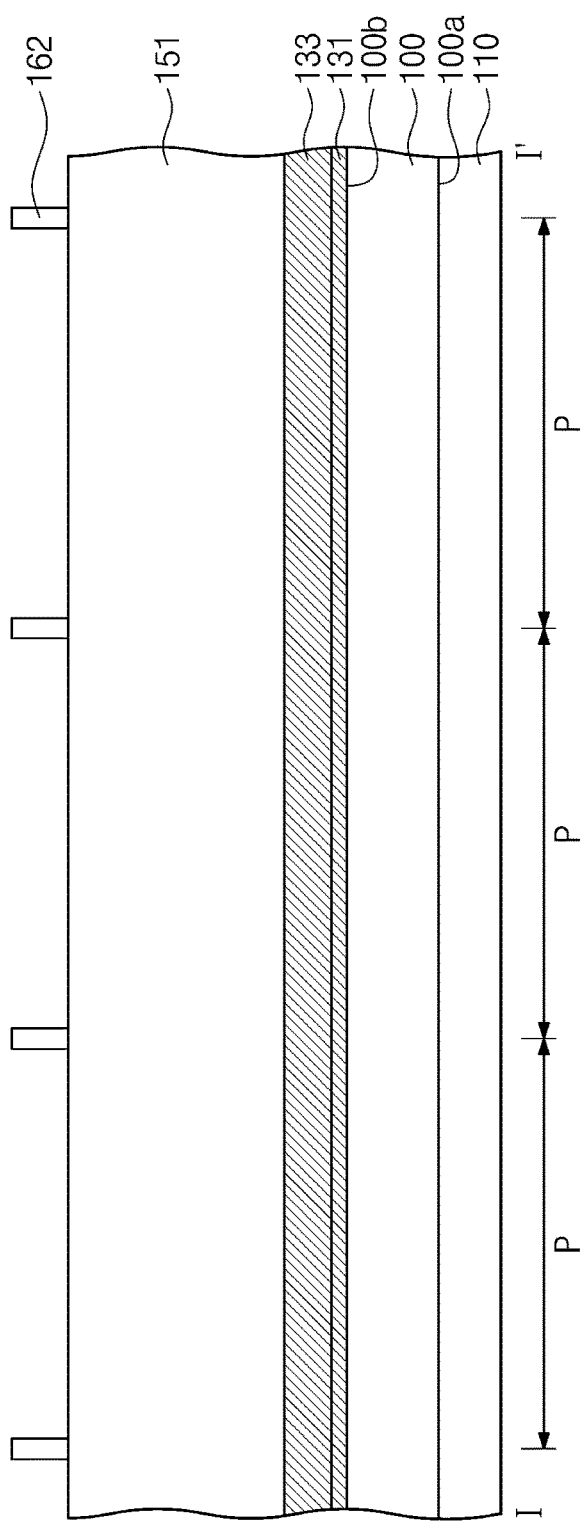

Referring to FIG. 7A, a first metal layer 131, a second metal layer 133, a hardmask layer 151, and a photomask pattern 162 may be formed on a second surface 100*b* of a substrate 100. An interconnect line structure 110 may be formed on a first surface 100*a* of the substrate 100. In an effort to simplify the drawings, antireflection layer 120 shown in FIG. 5 and various internal structural features in the substrate 100 and the interconnect line structure 110 as shown in FIG. 5, are omitted fron FIGS. 7A-7D. The internal structural features may have already been formed in the substrate 100 and the interconnect line structure 110 shown in FIGS. 7A-7D.

In more detail, the first metal layer 131 and the second metal layer 133 may be sequentially formed on or over the second surface 100*b* of the substrate 100. The first and second metal layers 131 and 133 may include different metals and/or alloys from each other. For example, the first metal layer 131 may include titanium nitride (TiN) and the second metal layer 133 may include tungsten (W), although in other embodiments first and second metal layers 131 and 133 may be formed of other metals or alloys. The second metal layer 133 may adhere the first metal layer 131 to the substrate 100.

The hardmask layer 151 may be formed on the second metal layer 133. For example, the hardmask layer 151 may be an spin on hardmask (SOH) layer. The photomask pattern 162 may be formed on the hardmask layer 151. The photomask pattern 162 may be formed by coating a photomask layer (not shown) and then patterning the photomask layer. As not shown in figures, an insulation layer (e.g., a low temperature oxide layer) may be additionally formed between the hardmask layer 151 and the photomask pattern 162.

Referring to FIG. 7B, a hardmask pattern 152 may be formed by etching the hardmask layer 151 using the photomask pattern 162 as an etching mask. For example, the hardmask layer 151 may be dry etched. An ashing/strip process may be performed to subsequently remove the photomask pattern 162.

Figure 7C:
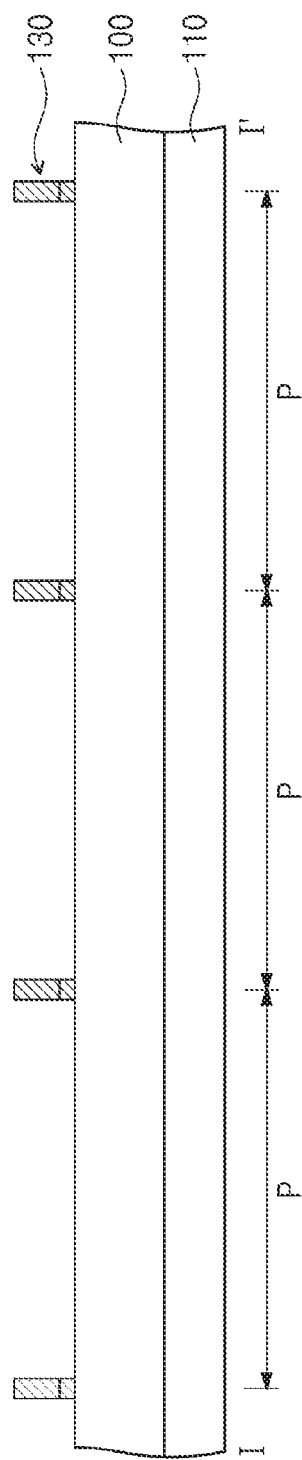

Referring to FIG. 7C, a grid pattern 130 may be formed by etching the first and second metal layers 131 and 133 using the hardmask pattern 152 as an etching mask. The first and second metal layers 131 and 133 may be, for example, dry etched. An ashing/strip process may be performed to subsequently remove the hardmask pattern 152.

Figure 7D:
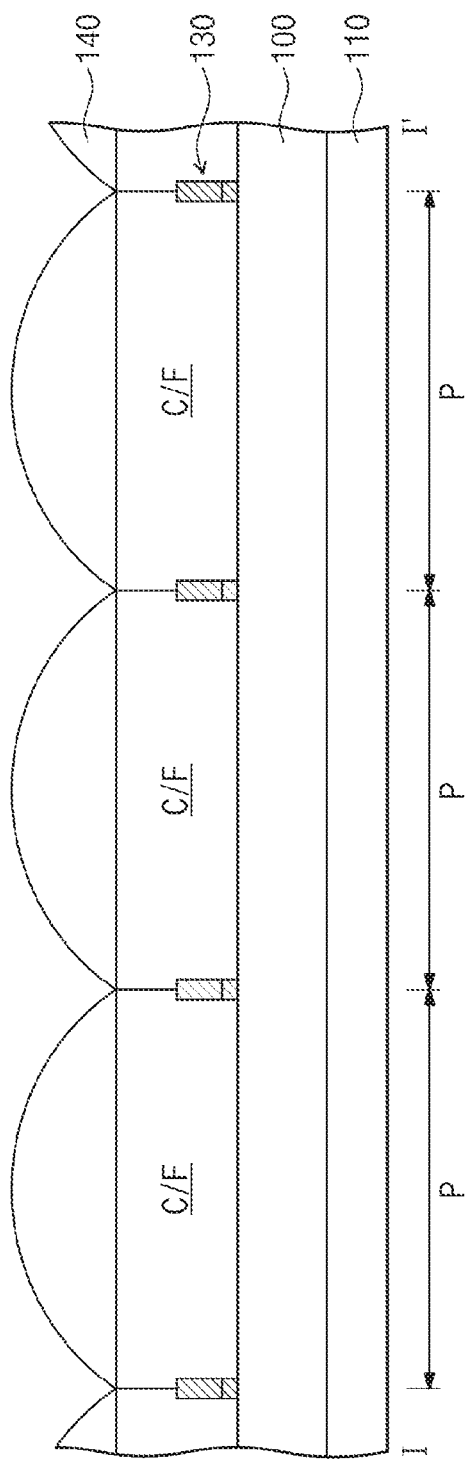

Referring to FIG. 7D, as shown in FIG. 5, a color filter C/F and a micro lens 140 may be formed on the substrate 100 and the grid pattern 130 of each of pixel regions P.

According to such method of fabricating an image sensor, an etching process may be performed using the hardmask layer 151 so that the grid pattern 130 may be formed to have a finely uniform width along the first direction. For example, the grid pattern 130 may have a width of about 100 nm or less.

Figure 8:
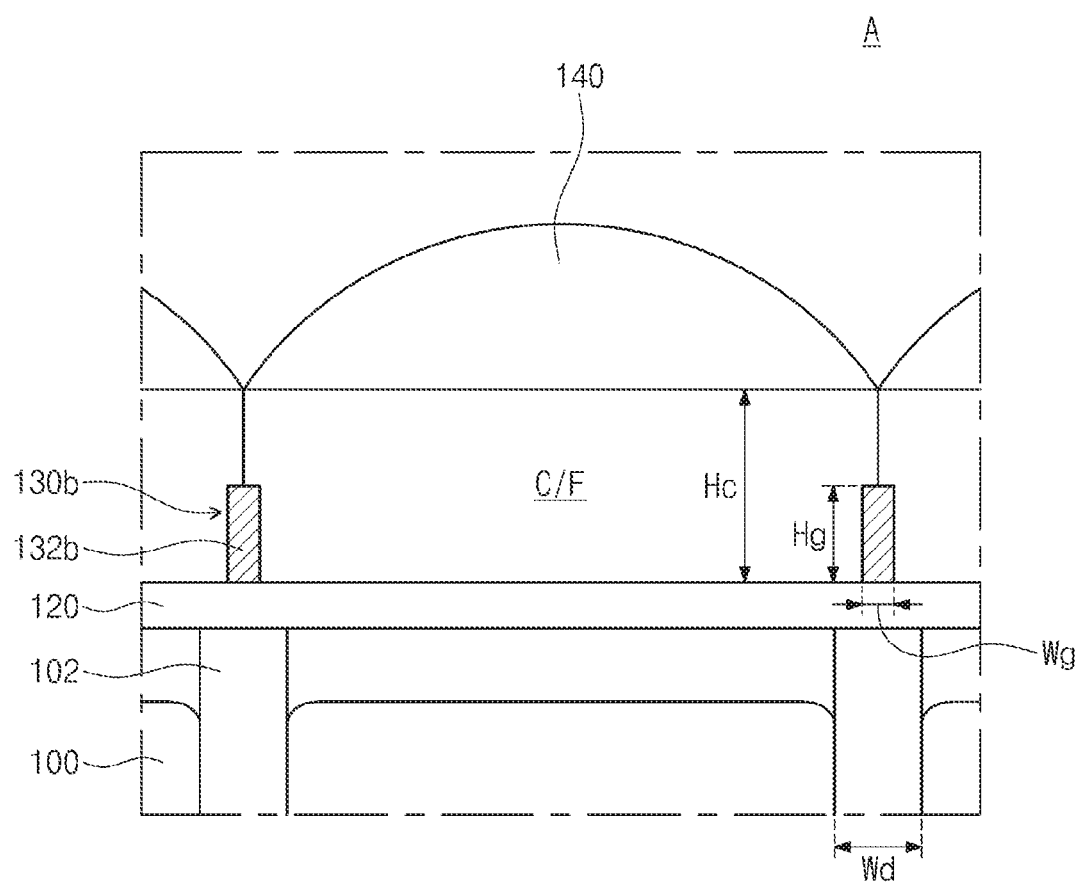
FIG. 8 illustrates an enlarged view of section A in FIG. 5, showing a grid pattern according to other embodiments of the inventive concept.

FIG. 8 illustrates an enlarged view of section A in FIG. 5, showing a grid pattern 130b according to other embodiments of the inventive concept. Referring to FIG. 8, the grid pattern 130b may be provided to include a single grid 132b. The grid 132b may be formed of a single metal or alloy. For example, the grid 132b may be formed of titanium (Ti) or titanium nitride (TiN), although in other embodiments grid 132b may be formed of other metals or alloys. The grid pattern 130b may have a width Wg that is substantially uniform along the first direction and less than a width Wd of the first device isolation layer 102 formed in the substrate 100. With regard to FIG. 8, the description of elements and configuration substantially the same as in FIG. 6 are omitted.

Figure 9:
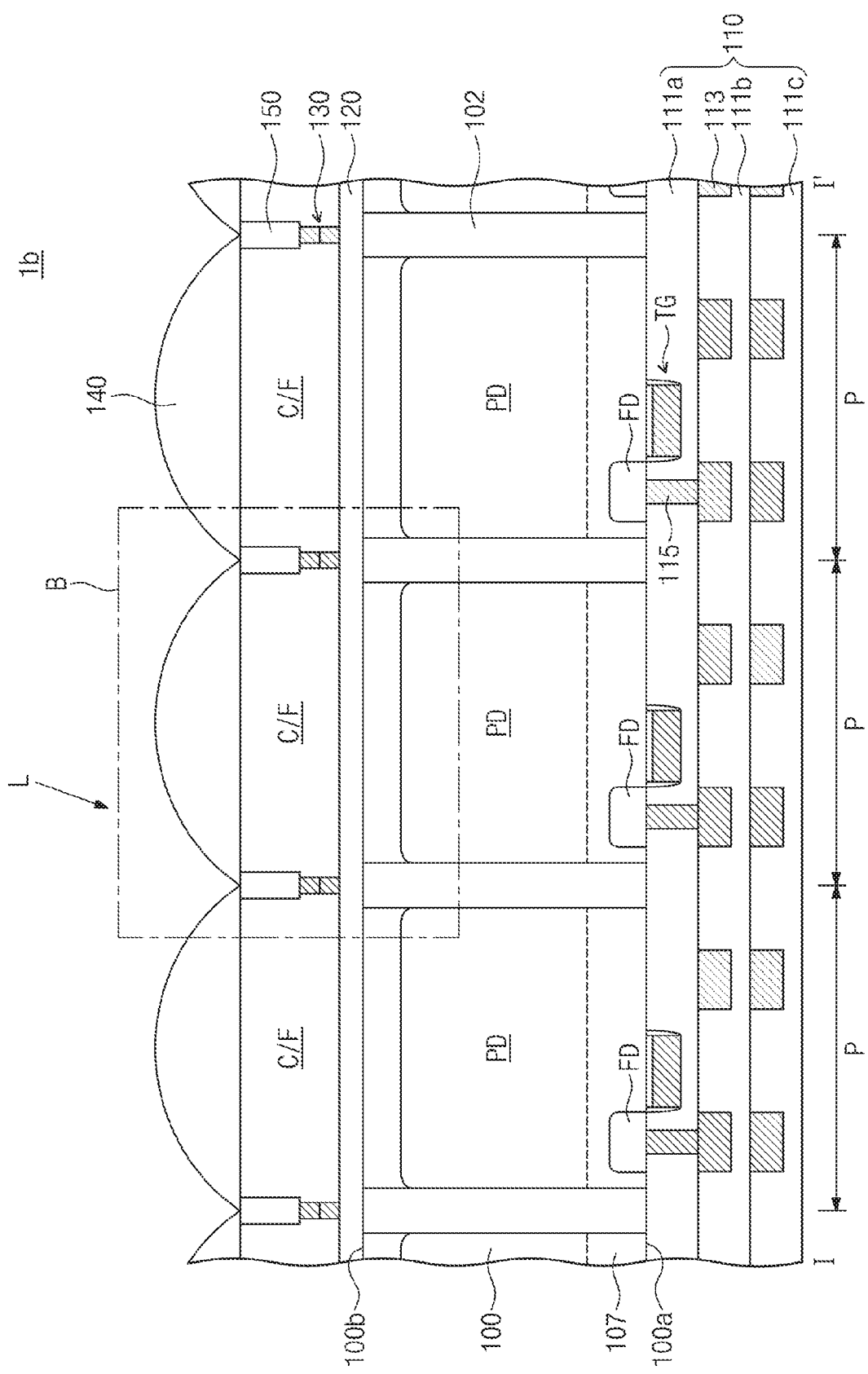
FIG. 9 illustrates a cross-sectional view taken along line I-I' of FIG. 4, illustrating an active pixel sensor array according to other embodiments of the inventive concept.
Figure 10:
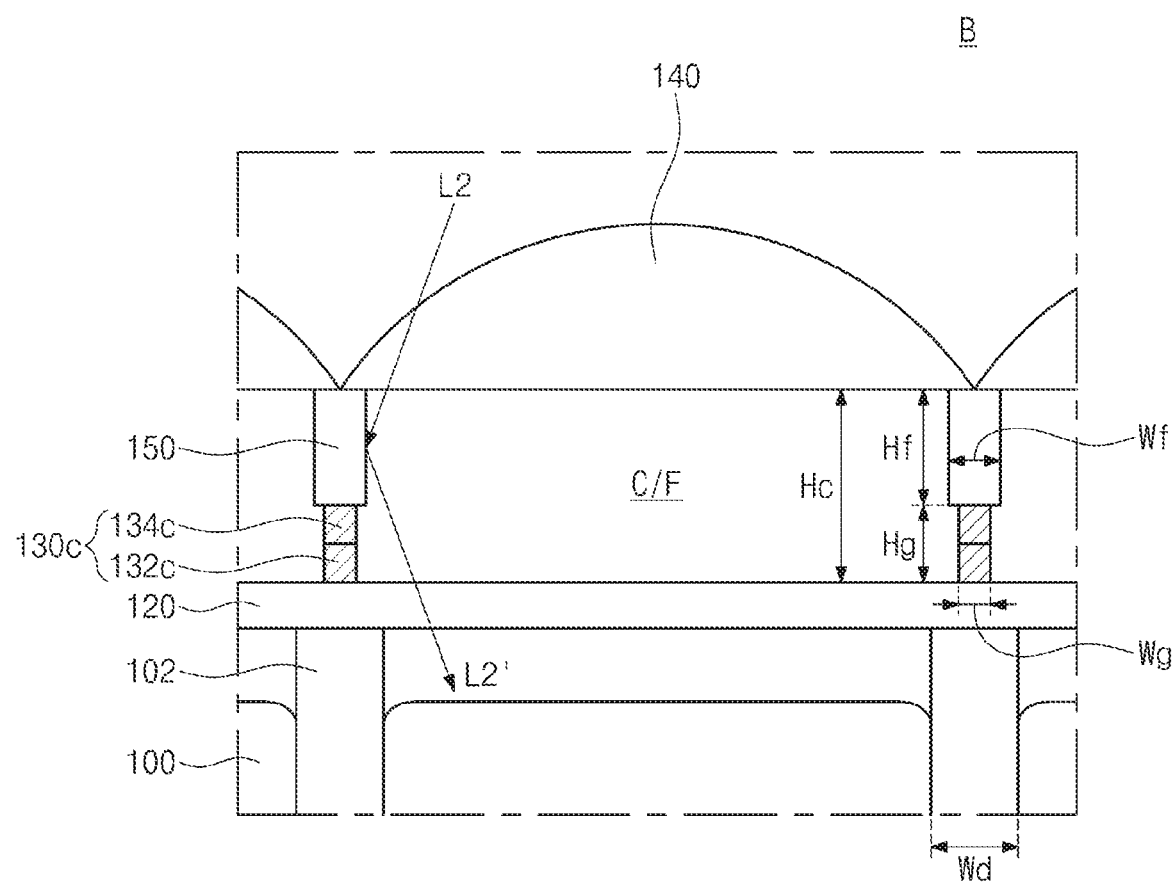
FIG. 10 illustrates an enlarged view of section B in FIG. 9.

FIG. 9 illustrates a cross-sectional view taken along line I-I' of FIG. 4, showing an active pixel sensor array 1b according to other embodiments of the inventive concept. FIG. 10 illustrates an enlarged view of section B in FIG. 9. In the discussion of the active pixel sensor array 1b, components substantially the same as those of the active pixel sensor array 1a described with reference to FIGS. 4 to 6 are allocated the same reference numerals thereto, and repetitive explanations may be omitted for brevity.

The active pixel sensor array 1b may further include a refractive fence 150. The refractive fence 150 may be disposed on a grid pattern 130c. Each of the color filters C/F may have a buried shape between adjacent stacking structures. Each of the stacking structures includes the grid pattern 130c and the refractive fence 150 that are stacked one atop the other. The refractive fence 150 may have a refractive index less than that of the grid pattern 130c. For example, the refractive index of the refractive fence 150 may be about 1.3 or less. The refractive fence 150 may include oxide, but in other embodiments may be other materials.

The refractive fence 150 may have a height Hf equal to or greater than a height Hg of the grid pattern 130c. For example, the height Hf of the refractive fence 150 may be equal to or greater than half the height Hc of each of the color filters C/F. The refractive fence 150 may have a width Wf equal to or greater than a width Wg of the grid pattern 130c. The width Wf of the refractive fence 150 may be equal to or less than the width Wd of the first device isolation layer 102. The refractive fence 150 may totally reflect an obliquely incident light L2 so that the totally reflected light L2' may be incident into a corresponding one of the pixel regions P. An amount of light incident onto the corresponding pixel region P may thus be increased so that image sensor 1b may have enhanced sensitivity.

Figure 11:
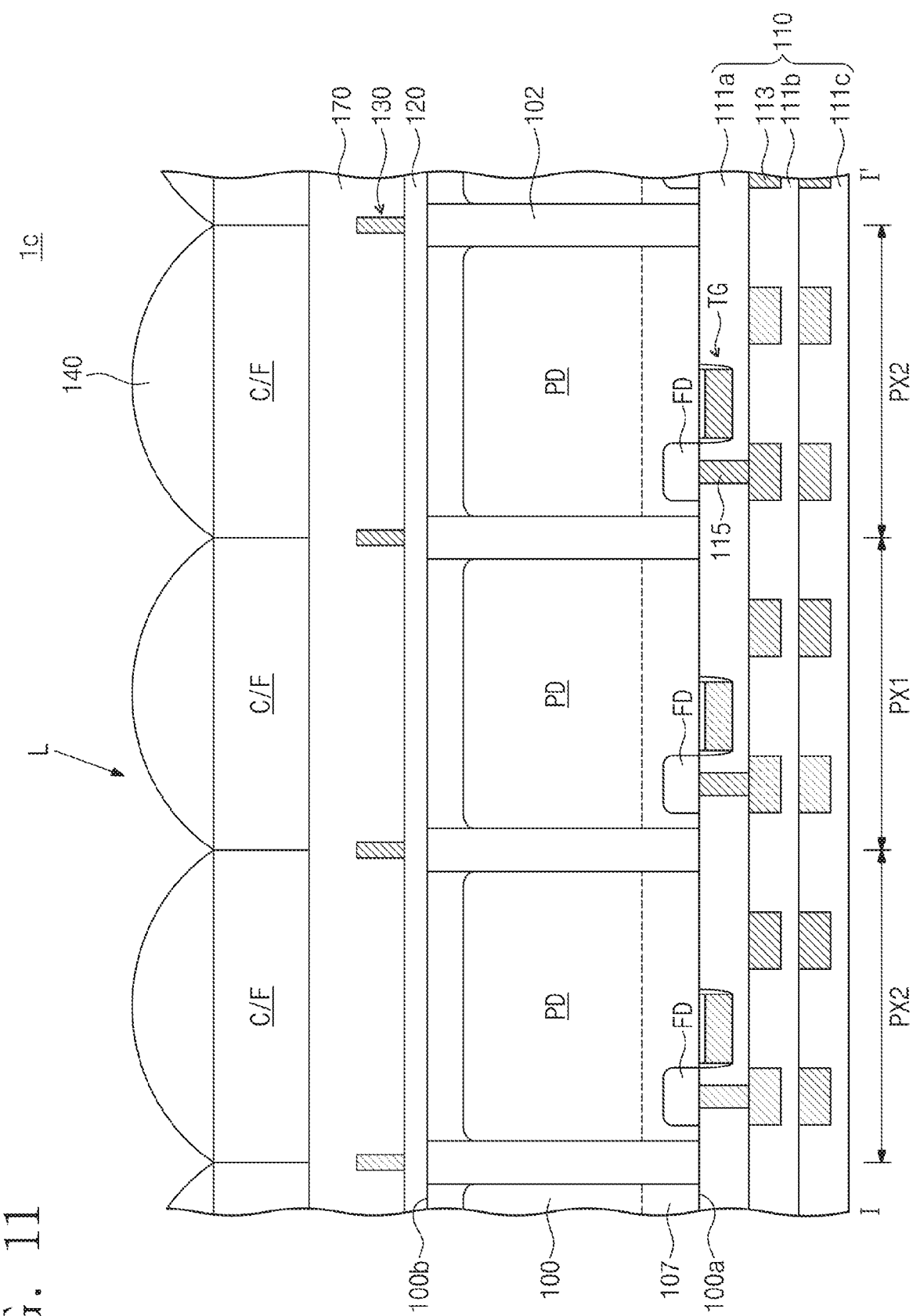
FIG. 11 illustrates a cross-sectional view taken along line I-I' of FIG. 4, illustrating an active pixel sensor array according to other embodiments of the inventive concept.

FIG. 11 illustrates a cross-sectional view taken along line I-I' of FIG. 4, showing an active pixel sensor array 1c according to embodiments of the inventive concept. In the discussion of the active pixel sensor array 1c, components substantially the same as those of the active pixel sensor array 1a described with reference to FIGS. 4 to 6 are allocated the same reference numerals thereto, and repetitive explanations may be omitted for brevity.

The active pixel sensor array 1c may further include a protective planarization layer 170 between the color filters C/F and the second surface 100b of the substrate 100. The protective planarization layer 170 may be a highly doped impurity layer. For example, the protective planarization layer 170 may be doped with p-type impurity such as boron (B). The grid pattern 130 may be disposed in the protective planarization layer 170. The grid pattern 130 in the active pixel sensor array 1c may be one of the aforementioned grid patterns 130a, 130b and 130c.

According to embodiments of the inventive concept, an etching process may be performed using the hardmask layer so that the grid pattern may be formed to have a finely uniform width. As the grid pattern has the finely uniform width, the pixel region may receive an increased amount of incident light such that sensitivity and SNR (signal-to-noise ratio) of the image sensor may be enhanced.

The effects of the embodiments of the inventive concept are not limited to the aforementioned effects. Other effects, not mentioned above, should be apparent and understood by one skilled in the art from the foregoing description and accompanying drawings.

These embodiments herein are presented to facilitate understanding of the present inventive concept and should not limit the scope of the inventive concept, and it is intended that the inventive concept covers the various combinations, modifications, and variations of the dislosed embodiments. The scope of the inventive concept should be defined by the technical spirit of the appended claims, and is intended to include all modifications and equivalents substantially falling within the spirit and scope of the inventive concept while not being limited by literary descriptions in the appended claims.

What is claimed is:
1. An image sensor, comprising:
    a device isolation layer disposed in a substrate and defining pixel regions;
    at least one grid pattern over a surface of the substrate; and a refractive fence on the grid pattern,
wherein the refractive fence is in direct contact with a top surface of the grid pattern and exposes a sidewall of the grid pattern,
wherein the at least one grid pattern overlaps the device isolation layer between adjacent pixel regions from among the pixel regions in a first direction perpendicular to the surface of the substrate, the at least one grid pattern having a bottom surface opposite to the top surface, each of the top surface and the bottom surface having a maximum width extending in a second direction perpendicular to the first direction that is the same and that is less than a width of the device isolation layer in the second direction,
wherein the refractive fence has a refractive index less than a refractive index of the at least one grid pattern and the refractive index of the refractive fence is 1.3 or less, and
wherein the at least one grid pattern comprises metal.

2. The image sensor of claim 1, wherein the maximum width of the at least one grid pattern is 100 nm or less.

3. The image sensor of claim 1, further comprising photoelectric conversion devices respectively in the pixel regions in the substrate, wherein the at least one grid pattern is spaced apart from at least one of the photoelectric conversion devices in the second direction.

4. The image sensor of claim 1, wherein the refractive fence has a height in the first direction greater than a height of the at least one grid pattern in the first direction.

5. The image sensor of claim 1, further comprising color filters disposed over the surface of the substrate and respectively provided over the pixel regions, wherein the refractive fence is disposed between adjacent color filters from among the color filters, a height of the refractive fence is greater than half a height of each of the color filters in the first direction.

6. The image sensor of claim 1, wherein the refractive fence has a width in the second direction that is greater than the maximum width of the at least one grid pattern and less than the width of the device isolation layer.

7. The image sensor of claim 1, wherein the at least one grid pattern comprises a first grid including a first metal disposed on a second grid including a second metal, and the first metal and the second metals are different metals.

8. The image sensor of claim 1, wherein a bottom surface of the refractive fence has a first portion and a second portion that are coplanar with each other, and the at least one grid pattern directly contacts the first portion of the bottom surface of the refractive fence and exposes the second portion of the bottom surface of the refractive fence.

9. An image sensor, comprising:
a device isolation layer disposed in a substrate and defining pixel regions;
a grid pattern over a surface of the substrate;
a refractive fence over the grid pattern; and
color filters disposed over the surface of the substrate and respectively provided over the pixel regions,
wherein the grid pattern overlaps the device isolation layer between adjacent pixel regions from among the pixel regions in a first direction perpendicular to the surface, the grid pattern having a maximum width in a second direction parallel to the surface of the substrate that is less than a width of the device isolation layer in the second direction,
wherein the refractive fence has a height in the first direction that is greater than a height of the grid pattern in the first direction, and
wherein the grid pattern and the refractive fence both directly contact the color filters and laterally surround the color filters in the second direction so that the color filters do not contact each other,
wherein the refractive fence has a maximum width in the second direction that is greater than the maximum width of the grid pattern, and
wherein a refractive index of the refractive fence is different than that of the grid pattern.

10. The image sensor of claim 9, wherein the maximum width of the grid pattern is 100 nm or less.

11. The image sensor of claim 9, further comprising photoelectric conversion devices respectively in the pixel regions in the substrate,
wherein the grid pattern is spaced apart from at least one of the photoelectric conversion devices along the second direction.

12. The image sensor of claim 9, wherein the refractive fence is disposed between adjacent color filters from among the color filters, and the height of the refractive fence is greater than half a height of each of the color filters in the first direction.

13. The image sensor of claim 12, wherein the maximum width of the refractive fence is less than the width of the device isolation layer.

14. An image sensor, comprising:
a device isolation layer disposed in a substrate and defining pixel regions;
a grid pattern over a surface of the substrate;
a refractive fence on the grid pattern; and
color filters disposed over the surface of the substrate and respectively provided over the pixel regions,
wherein the grid pattern overlaps the device isolation layer between adjacent pixel regions from among the pixel regions in a first direction perpendicular to the surface, the grid pattern having a width in a second direction perpendicular to the first direction that is less than a width of the device isolation layer in the second direction,
wherein the refractive fence is disposed between adjacent color filters from among the color filters, the refractive fence having a height in the first direction that is greater than half a height of each of the color filters in the first direction, and the refractive fence and the grid pattern isolate the color filters so that the adjacent color filters from among the color filters are not in contact with each other,
wherein the grid pattern comprises metal, and
wherein a bottom surface of the refractive fence has a first portion and a second portion that are coplanar with each other, and the grid pattern directly contacts the first portion of the bottom surface of the refractive fence and exposes the second portion of the bottom surface of the refractive fence.

15. The image sensor of claim 14, wherein the width of the grid pattern is 100 nm or less.

16. The image sensor of claim 14, further comprising photoelectric conversion devices respectively in over the pixel regions in the substrate,
wherein the grid pattern is spaced apart from at least one of the photoelectric conversion devices along the second direction.

17. The image sensor of claim 14, wherein the refractive fence has a width in the second direction that is greater than the width of the grid pattern and less than the width of the device isolation layer.

18. An image sensor, comprising:
a device isolation layer disposed in a substrate and defining pixel regions;
a grid pattern over a surface of the substrate;
a refractive fence on the grid pattern; and
color filters disposed over the surface of the substrate and respectively provided over the pixel regions,
wherein the grid pattern overlaps the device isolation layer between adjacent pixel regions from among the pixels regions in a first direction perpendicular to the surface, the grid pattern having a width in a second direction parallel to the surface of the substrate that is less than a width of the device isolation layer in the second direction parallel to the surface of the substrate,
wherein the refractive fence has a width in the second direction parallel to the surface of the substrate that is greater than the width of the grid pattern and less than the width of the device isolation layer, and the grid pattern contacts the color filters, and
wherein a bottom surface of the refractive fence has a first portion and a second portion that are coplanar with each other, and the grid pattern directly contacts the first portion of the bottom surface of the refractive fence, and one of the color filters directly contacts the second portion of the bottom surface of the refractive fence.

19. The image sensor of claim 18, wherein the width of the grid pattern is 100 nm or less.

20. The image sensor of claim 18, further comprising photoelectric conversion devices respectively in over the pixel regions in the substrate,
wherein the grid pattern is spaced apart from at least one of the photoelectric conversion devices in the second direction.

* * * * *